United States Patent
Maji et al.

(10) Patent No.: US 11,823,445 B2
(45) Date of Patent: Nov. 21, 2023

(54) OBJECT DETECTION NETWORK WITH SPATIAL UNCERTAINTY

(71) Applicant: Arm Limited, Cambridge (GB)

(72) Inventors: Partha Prasun Maji, Cambridge (GB); Tiago Manuel Lourenco Azevedo, Cambridge (GB)

(73) Assignee: Arm Limited, Cambridge (GB)

( * ) Notice: Subject to any disclaimer, the term of this patent is extended or adjusted under 35 U.S.C. 154(b) by 462 days.

(21) Appl. No.: 17/179,806

(22) Filed: Feb. 19, 2021

(65) Prior Publication Data

US 2022/0277159 A1  Sep. 1, 2022

(51) Int. Cl.
| | |
|---|---|
| *G06T 3/40* | (2006.01) |
| *G06V 20/10* | (2022.01) |
| *G06F 9/50* | (2006.01) |
| *G06N 7/08* | (2006.01) |
| *G06F 30/20* | (2020.01) |
| *G06N 3/08* | (2023.01) |

(52) U.S. Cl.
CPC ............ *G06V 20/10* (2022.01); *G06F 9/5027* (2013.01); *G06F 30/20* (2020.01); *G06N 3/08* (2013.01); *G06N 7/08* (2013.01); *G06T 3/40* (2013.01)

(58) Field of Classification Search
CPC ........ G06V 20/10; G06V 10/75; G06V 10/82; G06F 9/5027; G06F 30/20; G06F 17/16; G06F 18/214; G06F 18/2415; G06N 3/08; G06N 7/08; G06N 3/04; G06N 7/01; G06N 3/0464; G06N 3/063; G06N 3/045; G06N 3/084; G06T 3/40
USPC ......................................... 382/181
See application file for complete search history.

(56) References Cited

U.S. PATENT DOCUMENTS

2020/0257938 A1* 8/2020 Hamedi ............... G06V 10/761

\* cited by examiner

*Primary Examiner* — Stephen P Coleman
(74) *Attorney, Agent, or Firm* — LEVEQUE INTELLECTUAL PROPERTY LAW, P.C.

(57) ABSTRACT

A hardware accelerator for an object detection network and a method for detecting an object are provided. The present disclosure provides robust object detection that advantageously augments traditional deterministic bounding box predictions with spatial uncertainties for various computer vision applications, such as, for example, autonomous driving, robotic surgery, etc.

20 Claims, 7 Drawing Sheets

OBJECT DETECTION NETWORK WITH SPATIAL UNCERTAINTY

BACKGROUND

The present disclosure relates to computer systems. More particularly, the present disclosure relates to computer systems including object detection networks.

Prediction is a fundamental element of many classification and object detection networks that include machine learning (ML), such as, for example, ANNs with a single hidden layer (i.e., shallow ANNs), deep neural networks (DNNs) such as ANNs with multiple hidden layers (i.e., deep ANNs), convolutional neural networks (CNNs), recurrent neural networks (RNNs), etc., support vector machines (SVMs), decision trees, Bayesian networks, etc. However, a network never achieves 100% prediction accuracy due to many reasons, such as, for example, insufficient data for a class, out of distribution (OOD) input data (i.e., data that do not belong to any of the classes), etc. Networks implemented in both hardware and software are also susceptible to hard and soft errors, which may worsen the prediction accuracy or lead to a fatal event. Generally, classification and object detection networks simply provide the "best" prediction based on the input data and the underlying training methodology and data.

Object detection networks, such as CNNs, typically generate deterministic labels and object bounding boxes during inference. A bounding box is a rectangle that generally surrounds an object, and is defined by a location (i.e., an x, y coordinate pair), width and height. These deterministic outputs are often overconfident, producing false predictions of labels and bounding box locations and dimensions. Label uncertainties may be inferred using various techniques. Unfortunately, there are no known techniques for predicting bounding box spatial uncertainties, which may be important for many industrial applications where the object may not be fully detectable due to occlusion, lighting condition, etc.

DETAILED DESCRIPTION

Figure 1:
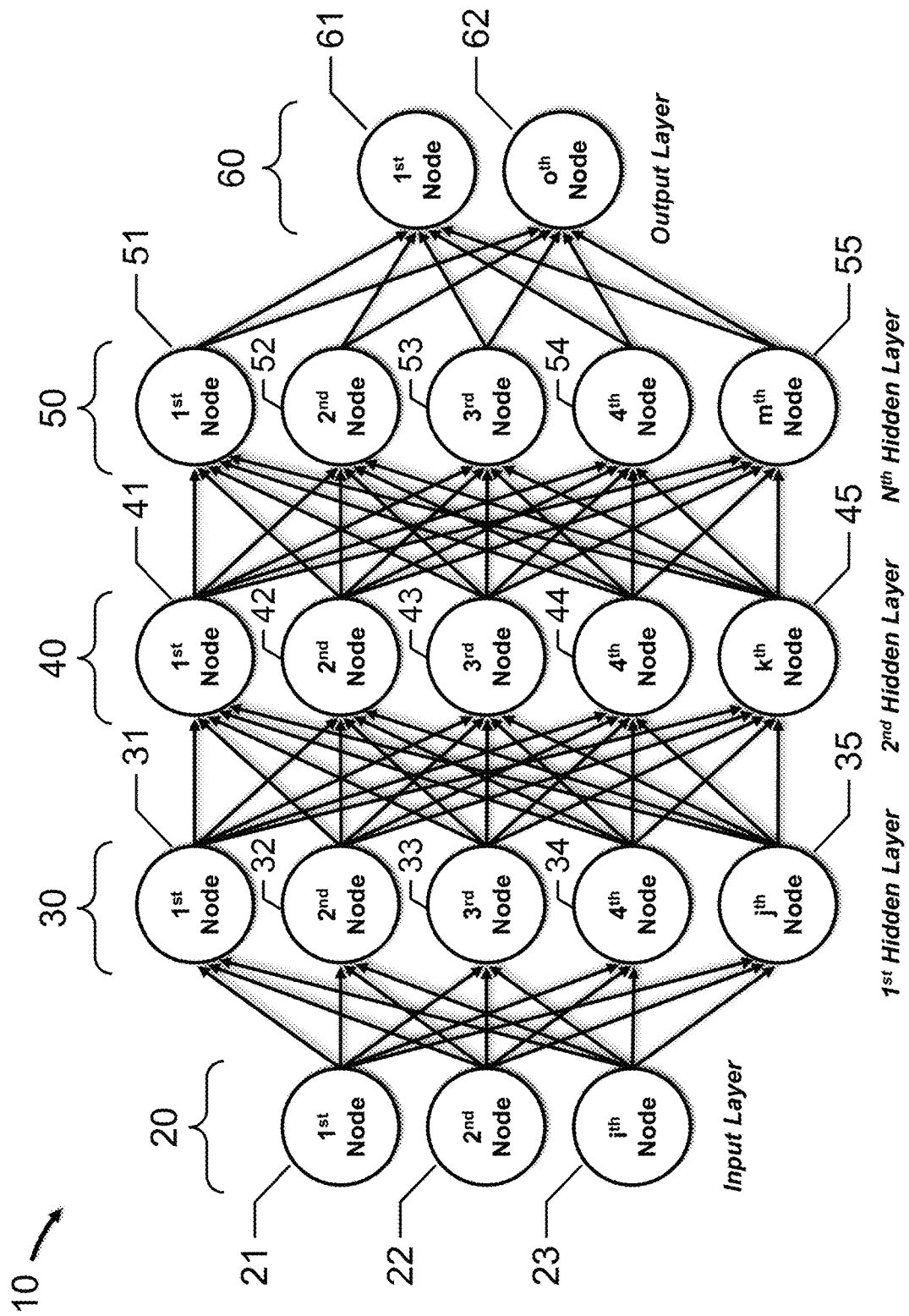
FIG. 1 depicts an ANN, in accordance with an embodiment of the present disclosure.

Embodiments of the present disclosure will now be described with reference to the drawing figures, in which like reference numerals refer to like parts throughout.

Embodiments of the present disclosure advantageously provide robust object detection that augments traditional deterministic bounding box predictions with spatial uncertainties for various computer vision applications, such as, for example, autonomous driving, robotic surgery, etc.

More particularly, embodiments of the present disclosure advantageously provide an object detection network that includes a backbone feature extraction (BFE) module, a feature detection (FD) module and a filter and averaging (FA) module.

The BFE module is configured to receive image data, or an image data set, that includes at least one object, and generate a number of feature tensors based on the image data. Each feature tensor has a different scale. In one embodiment, each feature tensor includes feature map data defined by a height, a width, and a number of channels, and the scale of the feature tensor is defined as height·width.

The FD module is configured to receive the feature tensors from the BFE module, perform a number of detection passes, and generate an intermediate tensor associated with each feature tensor. Each detection pass includes applying a random dropout mask to the feature tensors, and, for each feature tensor, determining scale-dependent bounding box spatial data that includes mean corner co-ordinates and covariance matrices for the corner co-ordinates for a number of scale-dependent bounding boxes for the object. Each intermediate tensor includes the scale-dependent bounding box spatial data for each detection pass for the associated feature tensor.

Application of the random dropout masks to the feature tensors during each detection pass advantageously introduces statistical randomness to the data, which, in turn, generates bounding box spatial uncertainty.

In one embodiment, the FD module includes a dropout mask generation module and a number of detector heads. The dropout mask generation module is configured to generate a random dropout mask for each feature tensor for each detection pass. Each detector head includes a number of convolutional modules and at least one dropout mask application module, and is configured to receive a different feature tensor. During each detection pass, each detector head determines the number of scale-dependent bounding boxes for the object based on the feature tensor and the respective dropout mask, the scale-dependent bounding box spatial data based on the number of scale-dependent bounding boxes, and objectness scores and class probabilities.

The FA module is configured to receive the intermediate tensors from the FD module, determine scale-independent bounding box spatial data based on the intermediate tensors, and generate an output tensor including the scale-independent bounding box spatial data. The scale-independent bounding box spatial data includes mean corner co-ordinates and covariance matrices for the corner co-ordinates for a scale-independent bounding box for the object.

An ANN models the relationships between input data or signals and output data or signals using a network of interconnected nodes that is trained through a learning process. The nodes are arranged into various layers, including, for example, an input layer, one or more hidden layers, and an output layer. The input layer receives input data, such as, for example, image data, and the output layer generates output data, such as, for example, a probability that the image data contains a known object. Each hidden layer provides at least a partial transformation of the input data to the output data. A DNN has multiple hidden layers in order to model complex, nonlinear relationships between input data and output data.

In a fully-connected, feedforward ANN, each node is connected to all of the nodes in the preceding layer, as well as to all of the nodes in the subsequent layer. For example, each input layer node is connected to each hidden layer node, each hidden layer node is connected to each input layer node and each output layer node, and each output layer node is connected to each hidden layer node. Additional hidden layers are similarly interconnected. Each connection has a weight value, and each node has an activation function, such as, for example, a linear function, a step function, a sigmoid function, a tanh function, a rectified linear unit (ReLU) function, etc., that determines the output of the node based on the weighted sum of the inputs to the node. The input data propagates from the input layer nodes, through respective connection weights to the hidden layer nodes, and then through respective connection weights to the output layer nodes.

More particularly, at each input node, input data is provided to the activation function for that node, and the output of the activation function is then provided as an input data value to each hidden layer node. At each hidden layer node, the input data value received from each input layer node is multiplied by a respective connection weight, and the resulting products are summed or accumulated into an activation value that is provided to the activation function for that node. The output of the activation function is then provided as an input data value to each output layer node. At each output layer node, the output data value received from each hidden layer node is multiplied by a respective connection weight, and the resulting products are summed or accumulated into an activation value that is provided to the activation function for that node. The output of the activation function is then provided as output data. Additional hidden layers may be similarly configured to process data.

A multi-layer perceptron (MLP) is an ANN that has an input layer, an output layer and one or more hidden layers. MLPs may be used for natural language processing applications, such as machine translation, speech recognition, etc. Other ANNs include recurrent neural networks (RNNs), long short-term memories (LSTMs), sequence-to-sequence models that include an encoder RNN and a decoder RNN, shallow neural networks, etc.

A CNN is a variation of an MLP that may be used for classification or recognition applications, such as image recognition, speech recognition, etc. A CNN has an input layer, an output layer and multiple hidden layers including convolutional layers, pooling layers, normalization layers, fully-connected layers, etc. Each convolutional layer applies a sliding dot product or cross-correlation to an input volume, applies an activation function to the results, and then provides the activation or output volume to the next layer. Convolutional layers typically use the ReLU function as the activation function. In certain embodiments, the activation function is provided in a separate activation layer, such as, for example, a ReLU layer. A pooling layer reduces the dimensions of the output volume received from the preceding convolutional layer, and may calculate an average or a maximum over small clusters of data, such as, for example, 2×2 matrices. In certain embodiments, a convolutional layer and a pooling layer may form a single layer of a CNN. The fully-connected layers follow the convolutional and pooling layers, and include a flatten layer and a classification layer, followed by a normalization layer that includes a normalization function, such as the SoftMax function. The output layer follows the last fully-connected layer; in certain embodiments, the output layer may include the normalization function.

FIG. 1 depicts ANN 10, in accordance with an embodiment of the present disclosure.

ANN 10 includes input layer 20, one or more hidden layers 30, 40, 50, etc., and output layer 60. Input layer 20 includes one or more input nodes 21, 22, 23, etc. Hidden layer 30 includes one or more hidden nodes 31, 32, 33, 34, 35, etc. Hidden layer 40 includes one or more hidden nodes 41, 42, 43, 44, 45, etc. Hidden layer 50 includes one or more hidden nodes 51, 52, 53, 54, 55, etc. Output layer 60 includes one or more output nodes 61, 62, etc. Generally, ANN 10 includes N hidden layers, input layer 20 includes "i" nodes, hidden layer 30 includes "j" nodes, hidden layer 40 includes "k" nodes, hidden layer 50 includes "m" nodes, and output layer 60 includes "o" nodes. Many variations of input, hidden and output layers are clearly possible, including hidden layers that are locally-connected, rather than fully-connected, to one another. An ANN with a single hidden layer 30 is a shallow ANN, while an ANN with multiple hidden layers 30, 40, etc. is a deep ANN, i.e., a DNN.

Training an ANN includes optimizing the connection weights between nodes by minimizing the prediction error of the output data until the ANN achieves a particular level of accuracy. One method is backpropagation, or backward propagation of errors, which iteratively and recursively determines a gradient descent with respect to the connection weights, and then adjusts the connection weights to improve the performance of the network.

Figure 2A:
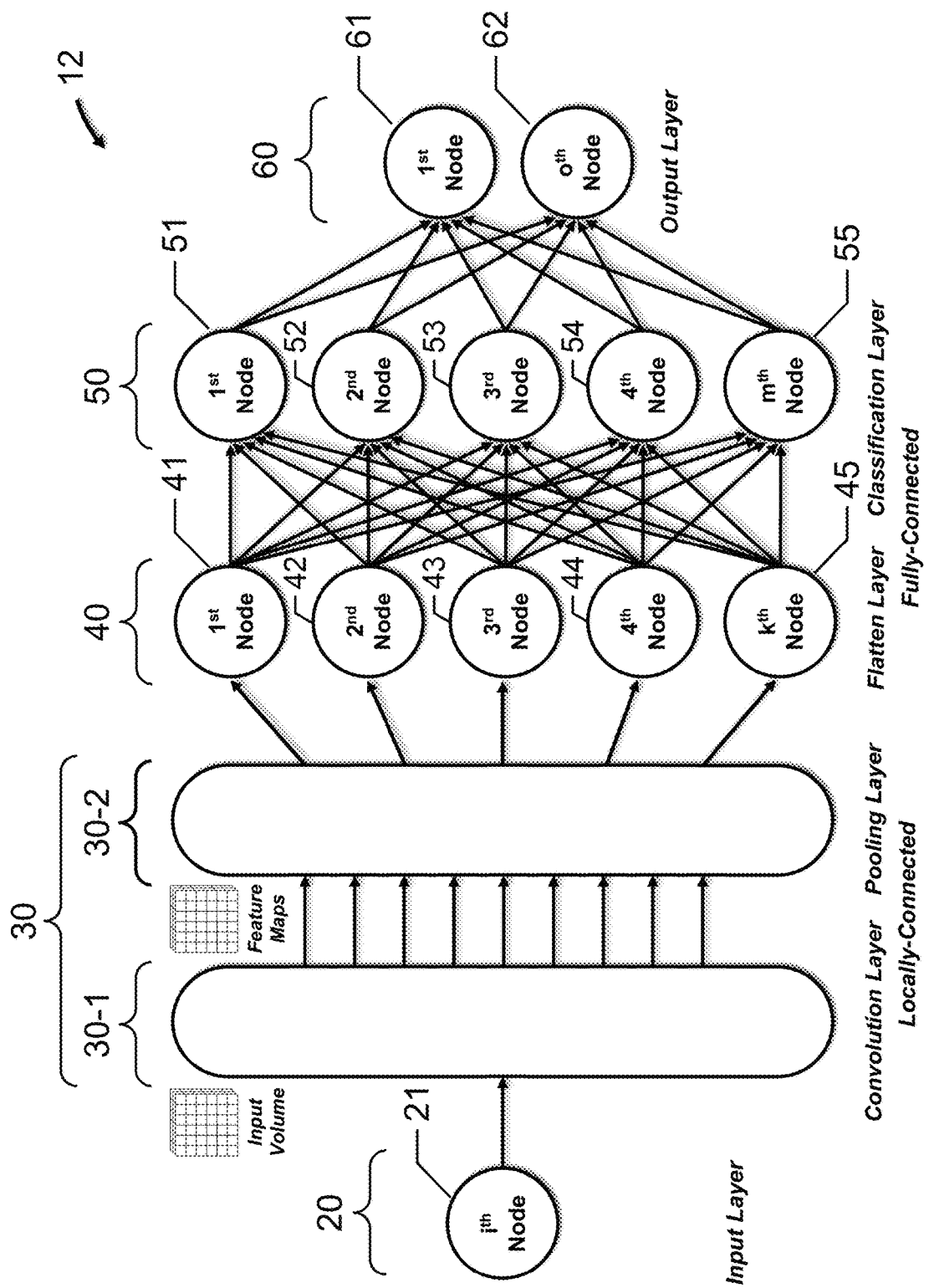
FIGS. 2A and 2B depict CNNs, in accordance with embodiments of the present disclosure.

FIG. 2A depicts CNN 12, in accordance with an embodiment of the present disclosure.

CNN 12 includes input layer 20, one or more hidden layers, such as convolutional layer 30-1, pooling layer 30-2, hidden (flatten) layer 40, hidden (classification) layer 50, etc., and output layer 60. Many other variations of input, hidden and output layers are contemplated. Because a CNN includes multiple hidden layers, a CNN is deep neural network, i.e., DNN.

Input layer 20 includes one or more input nodes 21, etc., that present the input data, such as a color image, as an input volume to the first convolutional layer, e.g., convolutional layer 30-1. The input volume is a three-dimensional matrix that has a width, a height and a depth. For example, input data that represent a color image may be presented as an input volume that is 512 pixels×512 pixels×3 channels (red, green, blue); other input volume dimensions may also be used, such as 32×32×3, 64×64×3, 128×128×3, etc., 32×32×1, 64×64×1, 128×128×1, 512×512×1, etc.

Convolutional layer 30-1 is locally-connected to input layer 20, and includes a plurality of nodes that are connected to local regions in the input volume (not depicted for clarity). For a CNN that uses a standard convolution, each node computes a dot product between the node's filter weights and the respective local region of the input volume to generate one element of an output volume. An activation function and a bias may be applied to each element of the output volume, and the output volume is then provided as the input volume to the next layer. The activation function and bias may be applied by each convolutional layer node or by the nodes of a subsequent locally-connected layer, such as a ReLU layer. The filters, or feature detectors, identify different features present in an image, such as edges, vertical lines, horizontal lines, bends, etc. The shallower convolutional layers extract higher-level features from the image, while the deeper convolutional layers extract lower-level features using a larger number of filters.

Pooling layer 30-2 is locally-connected to convolutional layer 30-1, and includes a plurality of nodes that are connected to local regions in the input volume (not depicted for clarity). Pooling layer 30-2 also produces an output volume that is provided as the input volume to the subsequent layer, such as, for example, another convolutional layer 30-1, a flatten layer 40, etc. In certain embodiments, convolutional layer 30-1 and pooling layer 30-2 form a single hidden layer 30. Similarly, in certain embodiments, convolutional layer 30-1, a ReLU layer and pooling layer 30-2 form a single hidden layer 30, while in other embodiments, convolutional layer 30-1, a batch normalization layer and a ReLU layer form a single hidden layer 30. Generally, the output volumes of the convolutional and pooling layers may be described as output feature maps, and one or more single hidden layers 30 form a feature learning portion of CNN 12.

Hidden layer 40 is a "flatten" layer that is locally-connected to pooling layer 30-2, and includes one or more hidden (flatten) nodes 41, 42, 43, 44, 45, etc. Hidden (flatten) layer 40 "flattens" the output volume produced by the preceding pooling layer 30-2 into a column vector, which is provided to the subsequent, fully-connected hidden layer 50.

Hidden layer 50 is a classification layer that is fully-connected to hidden (flatten) layer 40, and includes one or more hidden (classification) nodes 51, 52, 53, 54, 55, etc.

Output layer 60 includes one or more output nodes 61, 62, etc., and is fully-connected to hidden (classification) layer 50. Fully-connected output layer 60 receives the classification results output by hidden (classification) layer 50, and each node outputs a predicted class score. A normalization function, such as a Softmax function, may be applied to the predicted class scores by output layer 60, or, alternatively, by an additional layer interposed between hidden (classification) layer 50 and output layer 60.

Similar to ANNs, training a CNN includes optimizing the connection weights between nodes by minimizing the prediction error of the output data until the CNN achieves a particular level of accuracy. As noted above, backpropagation may be used to iteratively and recursively determines a gradient descent with respect to the connection weights, and then adjusts the connection weights to improve the performance of the network. Matrix multiplication operations, and, more particularly, MAC operations, are used extensively by CNNs, as well as other ANNs.

Figure 2B:
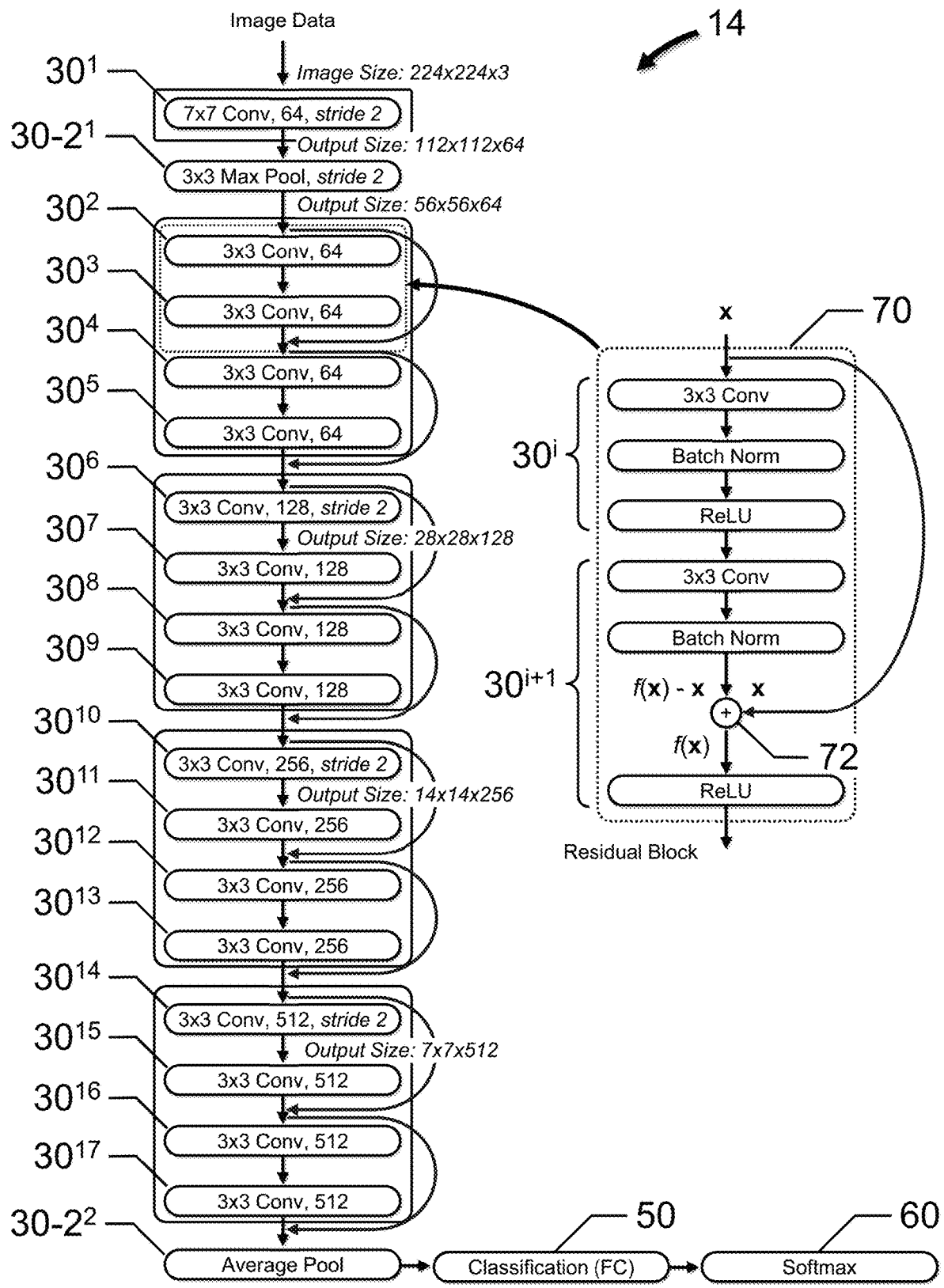

FIG. 2B depicts CNN 14, which is a Residual Network (ResNet).

Fundamentally, CNN 14 includes convolutional layer $30^1$, max pooling layer $30\text{-}2^1$, convolutional layer $30^2$, convolutional layer $30^3$, convolutional layer $30^4$, convolutional layer $30^5$, convolutional layer $30^6$, convolutional layer $30^7$, convolutional layer $30^8$, convolutional layer $30^9$, convolutional layer $30^{10}$, convolutional layer $30^{11}$, convolutional layer $30^{12}$, convolutional layer $30^{13}$, convolutional layer $30^{14}$, convolutional layer $30^{15}$, convolutional layer $30^{16}$, convolutional layer $30^{17}$, average pooling layer $30\text{-}2^2$, classification (fully connected) layer 50 and Softmax layer 60. The size of each convolution kernel and the number of filters in each convolutional layer are depicted in FIG. 2B. Each convolutional layer $30^i$ includes three layers, i.e., a convolutional layer 30-1, a batch normalization layer and an activation (ReLU) layer. In computer vision applications such as object classification, image data are presented to convolutional layer $30^1$, and Softmax layer 60 outputs the predicted label or class.

Convolutional layer $30^1$ has a kernel size of 3×3, 64 filters, and a stride of 2. Max pooling layer $30\text{-}2^1$ has a size of 3×3 and a stride of 2. Convolutional layers $30^2$, $30^3$, $30^4$ and $30^5$ have a kernel size of 3×3, 64 filters, and a stride of 1. Convolutional layer $30^6$ has a kernel size of 3×3, 128 filters, and a stride of 2, while convolutional layers $30^7$, $30^8$ and $30^9$ have a kernel size of 3×3, 128 filters, and a stride of 1. Convolutional layer $30^{10}$ has a kernel size of 3×3, 256 filters, and a stride of 2, while convolutional layers $30^{11}$, $30^{12}$ and $30^{13}$ have a kernel size of 3×3, 256 filters, and a stride of 1. Convolutional layer $30^{14}$ has a kernel size of 3×3, 512 filters, and a stride of 2, while convolutional layers $30^{15}$, $30^{16}$ and $30^{17}$ have a kernel size of 3×3, 512 filters, and a stride of 1.

CNN 14 not only connects the layers in sequence (represented by the straight arrow connections), but also periodically adds the input of one convolutional layer $30^i$ to the output of the batch normalization layer of the subsequent convolutional layer $30^{i+1}$ (represented by the curved arrow connections).

For the direct connections, each activation layer generates output feature maps, which are provided as input feature maps to the next convolution layer. Generally, these output feature maps are represented by a three dimensional matrix or feature tensor that defines the feature map data by a height (H), a width (W), and a number of channels (C). The scale of the feature tensor is defined as height·width (i.e., H×W).

For the additional connections, CNN 14 groups the constituent layers of two consecutive convolution layers $30^i$ and $30^{i+1}$ into a "residual block," as depicted by residual block 70. In addition to the constituent layers of convolution layers $30^i$ and $30^{i+1}$, each residual block 70 includes an addition element 72 to create a "skip connection" between consecutive convolution layers $30^i$ and $30^{i+1}$. The input to residual block 70 is denoted by "x". Without the skip connection, the desired underlying mapping to be learned during training is the residual mapping "f(x)". However, with the skip connection, the desired underlying mapping to be learned during training is the residual mapping "f(x)−x", which is easy to learn due to the identify mapping f(x)=x. Skip connections improve the training of CNN 14 by mitigating the vanishing gradient problem, and generally allow information to more freely flow between subsequent convolutional layers.

In the embodiment depicted in FIG. 2B, the size of the image data provided to convolution layer $30^1$ is 224×224×3 elements. Each element is a pixel having the same bit-length, e.g., 8 bits. Convolution layer $30^1$ outputs a feature tensor that has a size of 112×112×64 elements and a scale of 112×112. Max pooling layer $30\text{-}2^1$ outputs a feature tensor that has a size of 56×56×64 elements and a scale of 56×56. Convolution layers $30^2$, $30^3$, $30^4$ and $30^5$ output a feature tensor that has a size of 56×56×64 elements and a scale of 56×56. Convolution layers $30^6$, $30^7$, $30^8$ and $30^9$ output a feature tensor that has a size of 28×28×128 elements and a scale of 28×28. Convolution layers $30^{10}$, $30^{11}$, $30^{12}$ and $30^{13}$ output a feature tensor that has a size of 14×14×256 elements and a scale of 14×14. Convolution layer $30^{14}$, $30^{15}$, $30^{16}$ and $30^{17}$ outputs a feature tensor that has a size of 7×7×512 elements and a scale of 7×7. Average pooling layer $30\text{-}2^2$ outputs a feature tensor that has a size of 1×1×512 elements, classification (fully connected) layer 50 has 512× 1000 connections and outputs 1,000 elements, and Softmax layer 60 outputs 1,000 elements. Other configurations of CNN 14 are also contemplated.

Figure 3:
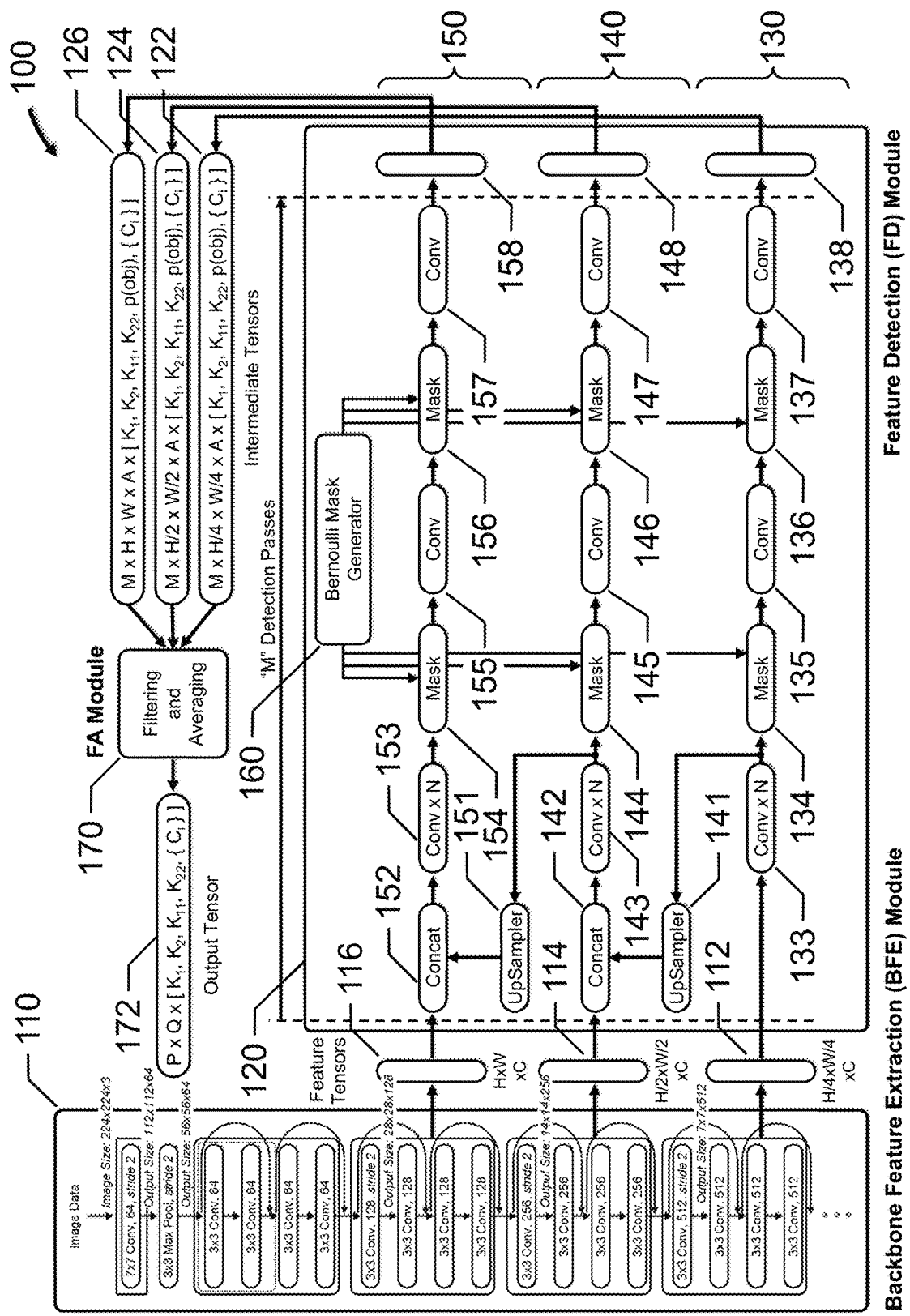
FIG. 3 depicts an object detection network, in accordance with an embodiment of the present disclosure.

FIG. 3 depicts object detection network 100, in accordance with an embodiment of the present disclosure.

Object detection network 100 includes BFE module 110, FD module 120 and FA module 170. BFE module 110 receives image data and generates feature tensors 112, 114 and 116. FD module 120 receives feature tensors 112, 114 and 116, and generates intermediate tensors 122, 124 and 126. FA module 170 receives intermediate tensors 122, 124 and 126, and generates output tensor 172.

Generally, BFE module 110 includes an ML model, such as, for example, an ANN, DNN, CNN, RNN, Bayesian network, etc., that performs object classification on image data. In the embodiment depicted in FIG. 3, BFE module 110 includes CNN 14, i.e., a ResNet model. In this embodiment, the final three layers of CNN 14 have been omitted or deactivated, i.e., average pooling layer $30\text{-}2^2$, classification layer 50 and Softmax layer 60, as indicated by the ellipses. In other embodiments, the final three layers of CNN 14 may be included or activated in order to provide a nominal predicted class for the image data.

Feature tensors 112, 114 and 116 are extracted from the ResNet model at three different layers that have three different scales, and provided to FD module 120. In this embodiment, feature tensor 112 has a size of 7×7×512 and a scale of 7×7, feature tensor 114 has a size of 14×14×256 and a scale of 14×14, and feature tensor 116 has a size of 28×28×128 and a scale of 28×28.

Feature tensor 112 may be extracted from CNN 14 after the activation layer of convolutional layer $30^{14}$, convolutional layer $30^{15}$, convolutional layer $30^{16}$ or convolutional layer $30^{17}$. Similarly, feature tensor 114 may be extracted from CNN 14 after the activation layer of convolutional layer $30^{10}$, convolutional layer $30^{11}$, convolutional layer $30^{12}$ or convolutional layer $30^{13}$, and feature tensor 116 may be extracted from CNN 14 after the activation layer of convolutional layer $30^6$, convolutional layer $30^7$, convolutional layer $30^8$ or convolutional layer $30^9$.

In many embodiments, each feature tensor is extracted after the activation layer of the last convolutional layer listed above, i.e., convolutional layer $30^9$ for feature tensor 116, convolutional layer $30^{13}$ for feature tensor 114, and convolutional layer $30^{17}$ for feature tensor 112. Other feature tensor sizes and scales may also be accommodated by the present disclosure.

Generally, FD module 120 includes an object detector that performs a number of detection passes. In the embodiment depicted in FIG. 3, FD module 120 includes a CNN-based object detector with three detector heads, i.e., detector head 130, detector head 140 and detector head 150, and dropout mask generation module 160. Detector head 130 receives feature tensor 112 from BFE module 110, detector head 140 receives feature tensor 114 from BFE module 110, and detector head 150 receives feature tensor 116 from BFE module 110.

Detector head 130 includes convolutional module 133, mask module 134, convolutional module 135, mask module 136, convolutional module 137, and intermediate tensor generation module 138. Convolutional module 133 receives feature tensor 112 from BFE module 110. Mask module 134 is coupled to convolutional module 133 and dropout mask generation module 160, and receives an updated feature tensor 112 from convolutional module 133 and a random dropout mask from dropout mask generation module 160. Convolutional module 135 is coupled to mask module 134, includes a convolutional layer, and receives a masked feature tensor 112 from mask module 134.

Mask module 136 is coupled to convolutional module 135 and dropout mask generation module 160, and receives an updated feature tensor 112 from convolutional module 135 and a random dropout mask from dropout mask generation module 160. Convolutional module 137 is coupled to mask module 136, includes a convolutional layer, and receives a masked feature tensor 112 from mask module 136. is coupled to convolutional module 137, and receives an updated feature tensor 112 from convolutional module 137.

Intermediate tensor generation module 138 generates intermediate tensor 122, which is associated with feature tensor 112 and includes, inter alia, scale-dependent bounding box spatial data including mean corner co-ordinates and covariance matrices for the corner co-ordinates for a number of scale-dependent bounding boxes for the object, as discussed below. In one embodiment, intermediate tensor 122 may be defined by Equation 1:

$$M \times H/4 \times W/4 \times A \times [K_1, K_2, K_{11}, K_{22}, p(obj), \{C_i\}] \qquad \text{Eq. 1}$$

where M is the number of detection passes, H/4×W/4 are the scale of feature tensor 112 (e.g., 7×7), A is the number of bounding boxes (or anchor bounding boxes), $K_1$ is the bounding box mean first corner co-ordinates (i.e., $x_1, y_1$), $K_2$ is the bounding box mean second corner co-ordinates (i.e., $x_2, y_2$), $K_{11}$ is the bounding box covariance matrix for the first corner co-ordinates, $K_{22}$ is the bounding box covariance matrix for the second corner co-ordinates, p(obj) are the objectness scores, and $\{C_i\}$ are the class probabilities. $K_{11}$ and $K_{22}$ are given by Equation 2:

$$K_{11} = \begin{bmatrix} \sigma^1_{xx} & \sigma^1_{xy} \\ \sigma^1_{yx} & \sigma^1_{yy} \end{bmatrix} K_{22} = \begin{bmatrix} \sigma^2_{xx} & \sigma^2_{xy} \\ \sigma^2_{yx} & \sigma^2_{yy} \end{bmatrix} \qquad \text{Eq. 2}$$

where the sigma values are the variances and covariances of the respective co-ordinates. In many embodiments, the objectness score is a Softmax score that a bounding box contains an object, and the class probabilities are the Softmax scores for each possible label.

The number of bounding boxes, A, is typically at least two—one horizontal rectangle (e.g. objects like cars, bus, truck) and one vertical rectangle (e.g. objects like pedestrian, bikes etc.).

Detector head 140 includes up-sampler module 141, concatenation module 142, convolutional module 143, mask module 144, convolutional module 145, mask module 146, convolutional module 147, and intermediate tensor generation module 148. Up-sampler module 141 is coupled to convolutional module 133, and receives an updated feature tensor 112 from convolutional module 133. Concatenation module 142 is coupled to up-sampler module 141, and receives feature tensor 114 from BFE module 110 and an up-scaled feature tensor 112 from up-sampler module 141. Convolutional module 143 is coupled to concatenation module 142, and receives a concatenated feature tensor 114 from concatenation module 142.

Mask module 144 is coupled to convolutional module 143 and dropout mask generation module 160, and receives an updated feature tensor 114 from convolutional module 143 and a random dropout mask from dropout mask generation module 160. Convolutional module 145 is coupled to mask module 144, includes a convolutional layer, and receives a masked feature tensor 114 from mask module 144. Mask module 146 is coupled to convolutional module 145 and dropout mask generation module 160, and receives an updated feature tensor 114 from convolutional module 145 and a random dropout mask from dropout mask generation module 160. Convolutional module 147 is coupled to mask module 146, includes a convolutional layer, and receives a masked feature tensor 114 from mask module 146. Intermediate tensor generation module 148 is coupled to convolutional module 147, and receives an updated feature tensor 114 from convolutional module 147.

Intermediate tensor generation module 148 generates intermediate tensor 124, which is associated with feature tensor 114 and includes, inter alia, scale-dependent bounding box spatial data including mean corner co-ordinates and covariance matrices for the corner co-ordinates for a number of scale-dependent bounding boxes for the object, as discussed below. In one embodiment, intermediate tensor 124 may be defined by Equation 3:

$$M \times H/2 \times W/2 \times A \times [K_1, K_2, K_{11}, K_{22}, p(obj), \{C_i\}] \qquad \text{Eq. 3}$$

where H/2×W/2 are the scale of feature tensor 114 (e.g., 14×14), and the remaining elements are given above.

Detector head 150 includes up-sampler module 151, concatenation module 152, convolutional module 153, mask module 154, convolutional module 155, mask module 156, convolutional module 157, and intermediate tensor generation module 158. Up-sampler module 151 is coupled to convolutional module 143, and receives an updated feature tensor 114 from convolutional module 143. Concatenation module 152 is coupled to up-sampler module 151, and receives feature tensor 116 from BFE module 110 and an up-scaled feature tensor 114 from up-sampler module 151. Convolutional module 153 is coupled to concatenation module 152, and receives a concatenated feature tensor 116 from concatenation module 152.

Mask module 154 is coupled to convolutional module 153 and dropout mask generation module 160, and receives an updated feature tensor 116 from convolutional module 153 and a random dropout mask from dropout mask generation module 160. Convolutional module 155 is coupled to mask module 154, includes a convolutional layer, and receives a masked feature tensor 116 from mask module 154. Mask module 156 is coupled to convolutional module 155 and dropout mask generation module 160, and receives an updated feature tensor 116 from convolutional module 155 and a random dropout mask from dropout mask generation module 160. Convolutional module 157 is coupled to mask module 156, includes a convolutional layer, and receives a masked feature tensor 116 from mask module 156. Intermediate tensor generation module 158 is coupled to convolutional module 157, and receives an updated feature tensor 116 from convolutional module 157.

Intermediate tensor generation module 158 generates intermediate tensor 126, which is associated with feature tensor 116 and includes, inter alia, scale-dependent bounding box spatial data including mean corner co-ordinates and covariance matrices for the corner co-ordinates for a number of scale-dependent bounding boxes for the object, as discussed below. In one embodiment, intermediate tensor 126 may be defined by Equation 4:

$$M \times H \times W \times A \times [K_1, K_2, K_{11}, K_{22}, p(obj), \{C_i\}] \qquad \text{Eq. 4}$$

where H×W are the scale of feature tensor 116 (e.g., 28×28), and the remaining elements are given above.

In one embodiment, each convolutional module includes group of layers including a first convolutional layer with a kernel size of 1×1 and 512 filters, a second convolutional layer with a kernel size of 3×3 and 1,024 filters, a batch normalization layer and an activation layer. Convolutional modules 133, 143 and 153 include a number, N, of these layer groups; in one embodiment, N equals 2. Other convolutional kernel sizes, filter numbers and layer group numbers are also accommodated by the present disclosure.

Up-sampler module 141 receives an updated feature tensor 112 from convolutional module 133 and increases the scale of updated feature tensor 112 to match the scale of feature tensor 114, e.g., from 7×7 to 14×14. This may be performed, for example, by an "un-pooling" or average pooling routine. Similarly, up-sampler module 151 receives an updated feature tensor 114 from convolutional module 143 and increases the scale of updated feature tensor 114 to match the scale of feature tensor 116, e.g., from 14×14 to 28×28.

Concatenation module 142 concatenates feature tensor 114 and an up-scaled feature tensor 112 from up-sampler module 141 to generate a concatenated feature tensor 114. In this embodiment, concatenated feature tensor 114 has a size of 28×28×768, resulting from the concatenation of feature tensor 114 having a size of 28×28×256 and up-scaled feature tensor 112 having a size of 28×28×512. Similarly, concatenation module 152 concatenates feature tensor 116 and an up-scaled feature tensor 114 from up-sampler module 151 to generate a concatenated feature tensor 116. In this embodiment, concatenated feature tensor 116 has a size of 56×56×896, resulting from the concatenation of feature tensor 116 having a size of 56×56×128 and up-scaled and concatenated feature tensor 114 having a size of 56×56×768.

Up-scaling and concatenating the feature tensors advantageously extracts more features from the deeper layers of CNN 14 and combines them with the features extracted from the shallower layers.

In one embodiment, dropout mask generation module 160 includes a Bernoulli mask generator. A Bernoulli mask begins with a random seed, and the number of zeros in the mask depends on the dropout rate. The Bernoulli mask is then fed to a function, such as, for example, an XOR operation, which then emits a new random bit per cycle. After n cycles, a new random mask of length n is generated. The mask modules within each detector head 130, 140 and 150 receive a different size mask due to the different feature tensor scales. Detector head 130 receives a dropout mask with 49 elements (i.e., 7×7), detector head 140 receives a dropout mask with 196 elements (i.e., 14×14), and detector head 150 receives a dropout mask with 784 elements (i.e., 28×28).

In one embodiment, FA module 170 includes a Monte Carlo simulation model that process intermediate tensors 122, 124 and 126, and generates output tensor 172 which includes, inter alia, scale-independent bounding box spatial data including mean corner co-ordinates and covariance matrices for the corner co-ordinates for a number of scale-independent bounding boxes for the object, as discussed below. In one embodiment, output tensor 172 may be defined by Equation 5:

$$P \times Q \times [K_1, K_2, K_{11}, K_{22}, \{C_i\}] \qquad \text{Eq. 5}$$

where P is the number of grid rows, Q is the number of grid columns (i.e., P·Q is equal to the number of grid cells); the remaining elements are given above.

As discussed above, for each image data set processed by BFE module 110, each detector head 130, 140 and 150 receives a different feature tensor 112, 114 and 116 (respectively). The object detector then performs a number of detection passes to generate intermediate tensors 122, 124 and 126, such as, for example, 1,000 detection passes (i.e., M equals 1,000), 100 detection passes, 10 detection passes, 2,000 detection passes, etc. Dropout mask generation module 160 generates a random dropout mask for each feature tensor 112, 114 and 116 for each detection pass. During each detection pass, each detector head 130, 140 and 150 determines a number of scale-dependent bounding boxes for an object based on the respective feature tensors 112, 114 and 116 and the respective dropout masks, as well as the scale-dependent bounding box spatial data based on the number of scale-dependent bounding boxes. Each detector head may also determine objectness scores and class probabilities.

Generally, the processing performed by detector head 130 during a detection pass may be summarized as follows. Convolutional module 133 receives feature tensor 112 from BFE module 110, and performs convolutional operations on feature tensor 112 to update feature tensor 112. Mask module 134 performs a masking operation on feature tensor 112 to mask feature tensor 112. Convolutional module 135 performs convolutional operations on feature tensor 112 to update feature tensor 112. Mask module 136 performs a masking operation on feature tensor 112 to mask feature tensor 112. Convolutional module 137 performs convolutional operations on feature tensor 112 to update feature tensor 112. And, intermediate tensor generation module 138 generates intermediate tensor 122 associated with feature tensor 112.

Figure 4B:
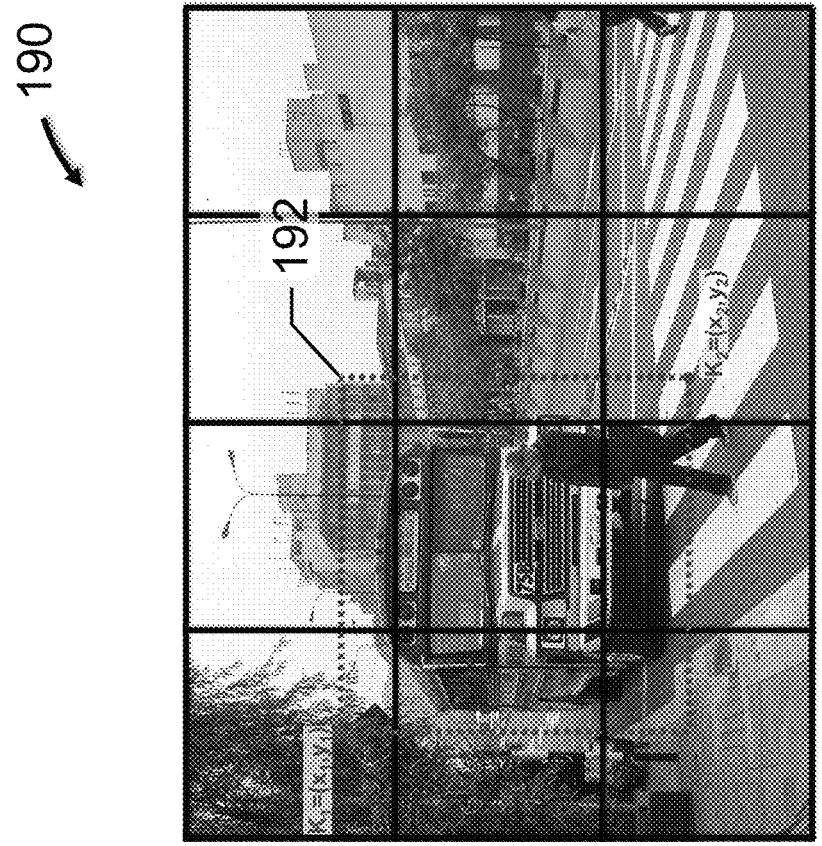
FIG. 4B depicts an image with a grid and a bounding box, in accordance with an embodiment of the present disclosure.
Figure 4A:
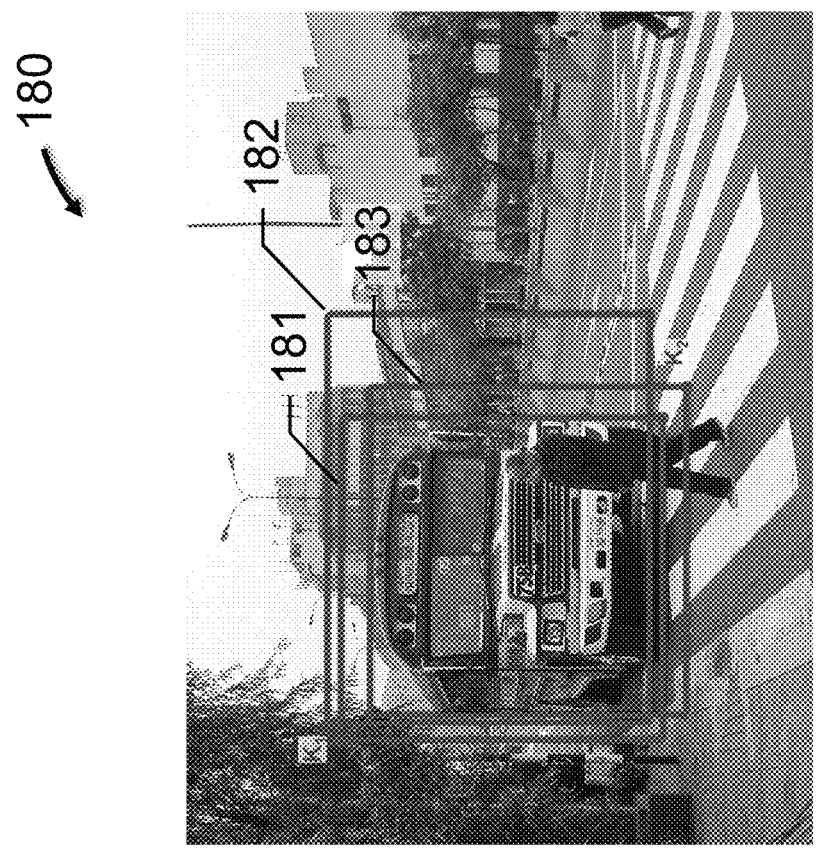
FIG. 4A depicts an image with bounding boxes, in accordance with an embodiment of the present disclosure.

FIG. 4A depicts an image 180 with bounding boxes, in accordance with an embodiment of the present disclosure. Image 180 includes at least one object of interest, i.e., a bus. Scale-dependent bounding boxes 181, 182 and 183, as well as the general locations of $K_1$ and $K_2$ for intermediate tensor 122, are depicted. In this example, there are three anchor bounding boxes (i.e., A equals 3) for intermediate tensor 122. Scale-dependent bounding boxes for intermediate tensors 124 and 126, generated by detector heads 140 and 150, respectively, are not depicted for clarity.

The processing performed by detector head 140 during a detection pass may be summarized as follows. Up-sampler module 141 receives feature tensor 112 from convolutional module 133, and increases the scale of feature tensor 112 to match the scale of feature tensor 114. Concatenation module 142 receives feature tensor 114 from BFE module 110, and concatenates up-scaled feature tensor 112 and feature tensor 114. Convolutional module 143 performs convolutional operations on feature tensor 114 to update feature tensor 114. Mask module 144 performs a masking operation on feature tensor 114 to mask feature tensor 114. Convolutional module 145 performs convolutional operations on feature tensor 114 to update feature tensor 114. Mask module 146 performs a masking operation on feature tensor 114 to mask feature tensor 114. Convolutional module 147 performs convolutional operations on feature tensor 114 to update feature tensor 114. And, intermediate tensor generation module 148 generates intermediate tensor 124 associated with feature tensor 114.

The processing performed by detector head 150 during a detection pass may be summarized as follows. Up-sampler module 151 receives feature tensor 114 from convolutional module 143, and increases the scale of feature tensor 114 to match the scale of feature tensor 116. Concatenation module 152 receives feature tensor 116 from BFE module 110, and concatenates up-scaled feature tensor 114 and feature tensor 116. Convolutional module 153 performs convolutional operations on feature tensor 116 to update feature tensor 116. Mask module 154 performs a masking operation on feature tensor 116 to mask feature tensor 116. Convolutional module 155 performs convolutional operations on feature tensor 116 to update feature tensor 116. Mask module 156 performs a masking operation on feature tensor 116 to mask feature tensor 116. Convolutional module 157 performs convolutional operations on feature tensor 116 to update feature tensor 116. And, intermediate tensor generation module 158 generates intermediate tensor 126 associated with feature tensor 116.

FA module 170 then process intermediate tensors 122, 124 and 126, and generates output tensor 172 which includes, inter alia, scale-independent bounding box spatial data including mean corner co-ordinates and covariance matrices for the corner co-ordinates for a number of scale-independent bounding boxes for the object.

FIG. 4B depicts an image 190 with a grid and a bounding box, in accordance with an embodiment of the present disclosure. Image 190 includes the same object of interest, i.e., the bus. Scale-independent bounding box 192, and the general locations of $K_1$ and $K_2$ for output tensor 172, are depicted. In this example, the grid contains nine cells, i.e., P equals 3 and Q equals 3.

In an alternative embodiment, the number of detection passes, M, is divided into a first detection pass and a remaining number of detection passes, M−1. The first detection pass is a complete detection pass, as described above, and the updated feature tensors 112, 114 and 116 output by convolutional modules 133, 143 and 153 are cached in memory for use as input feature tensors for the remaining detection passes. The remaining detection passes begin by processing cached feature tensors 112, 114 and 116 at mask modules 134, 144 and 154, respectively, which advantageously reduces processing load, increases execution speed, and improves system performance and flexibility by eliminating the processing at up-sampler modules 141 and 151, concatenation modules 142 and 152, and convolutional modules 133, 143 and 153.

Figure 5:
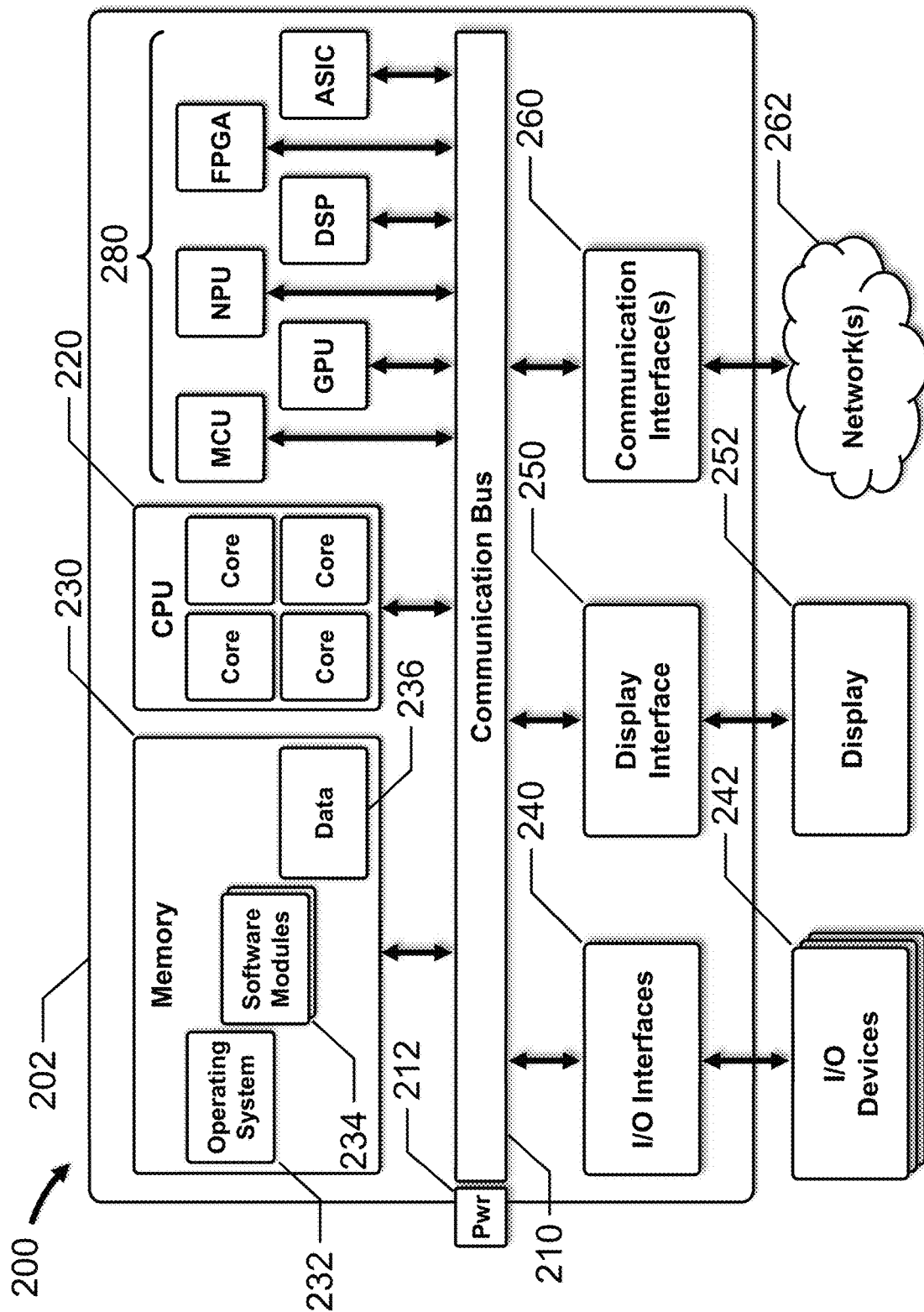
FIG. 5 depicts a block diagram of a system, in accordance with an embodiment of the present disclosure.

FIG. 5 depicts a block diagram of system 200, in accordance with an embodiment of the present disclosure.

System 200 includes computer 202, I/O devices 242 and display 252. Computer 202 includes communication bus 210 coupled to one or more processors 220, memory 230, I/O interfaces 240, display interface 250, one or more communication interfaces 260, and one or more HAs 280. Generally, I/O interfaces 240 are coupled to I/O devices 242 using a wired or wireless connection, display interface 250 is coupled to display 252, and communication interface 260 is connected to network 262 using a wired or wireless connection. In some embodiments, certain components of computer 202 are implemented as a system-on-chip (SoC); in other embodiments, computer 202 may be hosted on a traditional printed circuit board, motherboard, etc.

In some embodiments, system 200 is an embedded system in which one or more of the components depicted in FIG. 5 are not present, such as, for example, I/O interfaces 240, I/O devices 242, display interface 250, display 252, etc. Additionally, certain components, when present, may be optimized based on various design constraints, such as, for example, power, area, etc., such as, for example, HA 280.

Communication bus 210 is a communication system that transfers data between processor 220, memory 230, I/O interfaces 240, display interface 250, communication interface 260, HAs 280, as well as other components not depicted in FIG. 5. Power connector 212 is coupled to communication bus 210 and a power supply (not shown). In some embodiments, communication bus 210 is a network-on-chip (NoC).

Processor 220 includes one or more general-purpose or application-specific microprocessors that executes instructions to perform control, computation, input/output, etc. functions for system 200. Processor 220 may include a single integrated circuit, such as a micro-processing device, or multiple integrated circuit devices and/or circuit boards working in cooperation to accomplish the functions of processor 220. Additionally, processor 220 may include multiple processing cores, as depicted in FIG. 5. Generally, system 200 may include one or more processors 220, each containing one or more processing cores as well as various other modules.

In some embodiments, system 200 may include 2 processors 220, each containing multiple processing cores. For example, one processor 220 may be a high performance processor containing 4 "big" processing cores, e.g., Arm Cortex-A73, Cortex-A75, Cortex-A76, etc., while the other processor 220 may be a high efficiency processor containing 4 "little" processing cores, e.g., Arm Cortex-53, Arm Cortex-55, etc. In this example, the "big" processing cores include a memory management unit (MMU). In other embodiments, system 200 may be an embedded system that includes a single processor 220 with one or more processing cores, such as, for example, an Arm Cortex-M core. In these embodiments, processor 220 typically includes a memory protection unit (MPU).

In many embodiments, processor 220 may also be configured to execute classification-based machine learning (ML) models, such as, for example, ANNs, DNNs, CNNs, RNNs, SVM, Naïve Bayes, etc., and, more particularly, object detection network 100. In these embodiments, processor 220 may provide the same functionality as a hardware accelerator, such as HA 280. For example, system 200 may be an embedded system that does not include HA 280.

In addition, processor 220 may execute computer programs or modules, such as operating system 232, software modules 234, etc., stored within memory 230. For example, software modules 234 may include an autonomous vehicle application, a robotic application, such as, for example, a robot performing a surgical process, working with humans in a collaborative environment, etc., which may include a classification network, such as, for example, an ANN, a CNN, an RNN, a BNN, an SVM, Decision Trees, Bayesian networks, Naïve Bayes, etc., and, more particularly, object detection network 100.

Generally, storage element or memory 230 stores instructions for execution by processor 220 and data. Memory 230 may include a variety of non-transitory computer-readable medium that may be accessed by processor 220. In various embodiments, memory 230 may include volatile and non-volatile medium, non-removable medium and/or removable medium. For example, memory 230 may include any combination of random access memory (RAM), DRAM, SRAM, ROM, flash memory, cache memory, and/or any other type of non-transitory computer-readable medium.

Memory 230 contains various components for retrieving, presenting, modifying, and storing data. For example, memory 230 stores software modules that provide functionality when executed by processor 220. The software modules include operating system 232 that provides operating system functionality for system 200. Software modules 234 provide various functionality, such as image classification using CNNs, etc. Data 236 may include data associated with operating system 232, software modules 234, etc.

I/O interfaces 240 are configured to transmit and/or receive data from I/O devices 242. I/O interfaces 240 enable connectivity between processor 220 and I/O devices 242 by encoding data to be sent from processor 220 to I/O devices 242, and decoding data received from I/O devices 242 for processor 220. Generally, data may be sent over wired and/or wireless connections. For example, I/O interfaces 240 may include one or more wired communications interfaces, such as USB, Ethernet, etc., and/or one or more wireless communications interfaces, coupled to one or more antennas, such as WiFi, Bluetooth, cellular, etc.

Generally, I/O devices 242 provide input to system 200 and/or output from system 200. As discussed above, I/O devices 242 are operably connected to system 200 using a wired and/or wireless connection. I/O devices 242 may include a local processor coupled to a communication interface that is configured to communicate with system 200 using the wired and/or wireless connection. For example, I/O devices 242 may include a keyboard, mouse, touch pad, joystick, etc., sensors, actuators, etc.

Display interface 250 is configured to transmit image data from system 200 to monitor or display 252.

Communication interface 260 is configured to transmit data to and from network 262 using one or more wired and/or wireless connections. Network 262 may include one or more local area networks, wide area networks, the Internet, etc., which may execute various network protocols, such as, for example, wired and/or wireless Ethernet, Bluetooth, etc. Network 262 may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

HAs 280 are configured to execute, inter alia, classification networks, such as, for example, ANNs, CNNs, object detection network 100, etc., in support of various applications embodied by software modules 234. Generally, HAs 280 include one or more processors, coprocessors, processing engines (PEs), compute engines (CEs), etc., such as, for example, CPUs, GPUs, NPUs (e.g., the ARM ML Processor), DSPs, field programmable gate arrays (FPGAs), application specific integrated circuits (ASICs), controllers, microcontrollers, matrix multiplier circuits, MAC arrays, etc. HAs 280 also include a communication bus interface as well as non-volatile and/or volatile memories, such as, for example, ROM, flash memory, SRAM, DRAM, etc.

In many embodiments, HA 280 receives the ANN model and weights from memory 230 over communication bus 210 for storage in local volatile memory (e.g., SRAM, DRAM, etc.). In other embodiments, HA 280 receives a portion of the ANN model and weights from memory 230 over communication bus 210. In these embodiments, HA 280 determines the instructions needed to execute the ANN model or ANN model portion. In other embodiments, the ANN model (or ANN model portion) simply includes the instructions needed to execute the ANN model (or ANN model portion). In these embodiments, processor 220 determines the instructions needed to execute the ANN model, or, processor 220 divides the ANN model into ANN model portions, and then determines the instructions needed to execute each ANN model portion. The instructions are then provided to HA 280 as the ANN model or ANN model portion.

In further embodiments, HA 280 may store ANN models, instructions and weights in non-volatile memory. In some embodiments, the ANN model may be directly implemented in hardware using DSPs, FPGAs, ASICs, controllers, microcontrollers, adder circuits, multiply circuits, MAC circuits, etc. Generally, HA 280 receives input data from memory 230 over communication bus 210, and transmit output data to memory 230 over communication bus 210. In some embodiments, the input data may be associated with a layer (or portion of a layer) of the ANN model, and the output data from that layer (or portion of that layer) may be transmitted to memory 230 over communication bus 210.

For example, the ARM ML Processor supports a variety of ANNs, CNNs RNNs, etc., for classification, object detection, image enhancements, speech recognition and natural language understanding. The ARM ML Processor includes a control unit, a direct memory access (DMA) engine, local memory and 16 CEs. Each CE includes, inter alia, a MAC engine that performs convolution operations, a programmable layer engine (PLE), local SRAM, a weight decoder, a control unit, a direct memory access (DMA) engine, etc. Each MAC engine performs up to eight 16-wide dot products with accumulation. Generally, the PLE performs nonconvolution operations, such as, for example, pooling operations, ReLU activations, etc. Each CE receives input feature maps (IFMs) and weights sets over the NoC and stores them in local SRAM. The MAC engine and PLE process the IFMs to generate the output feature maps (OFMs), which are also stored in local SRAM prior to transmission over the NoC.

Figure 6:
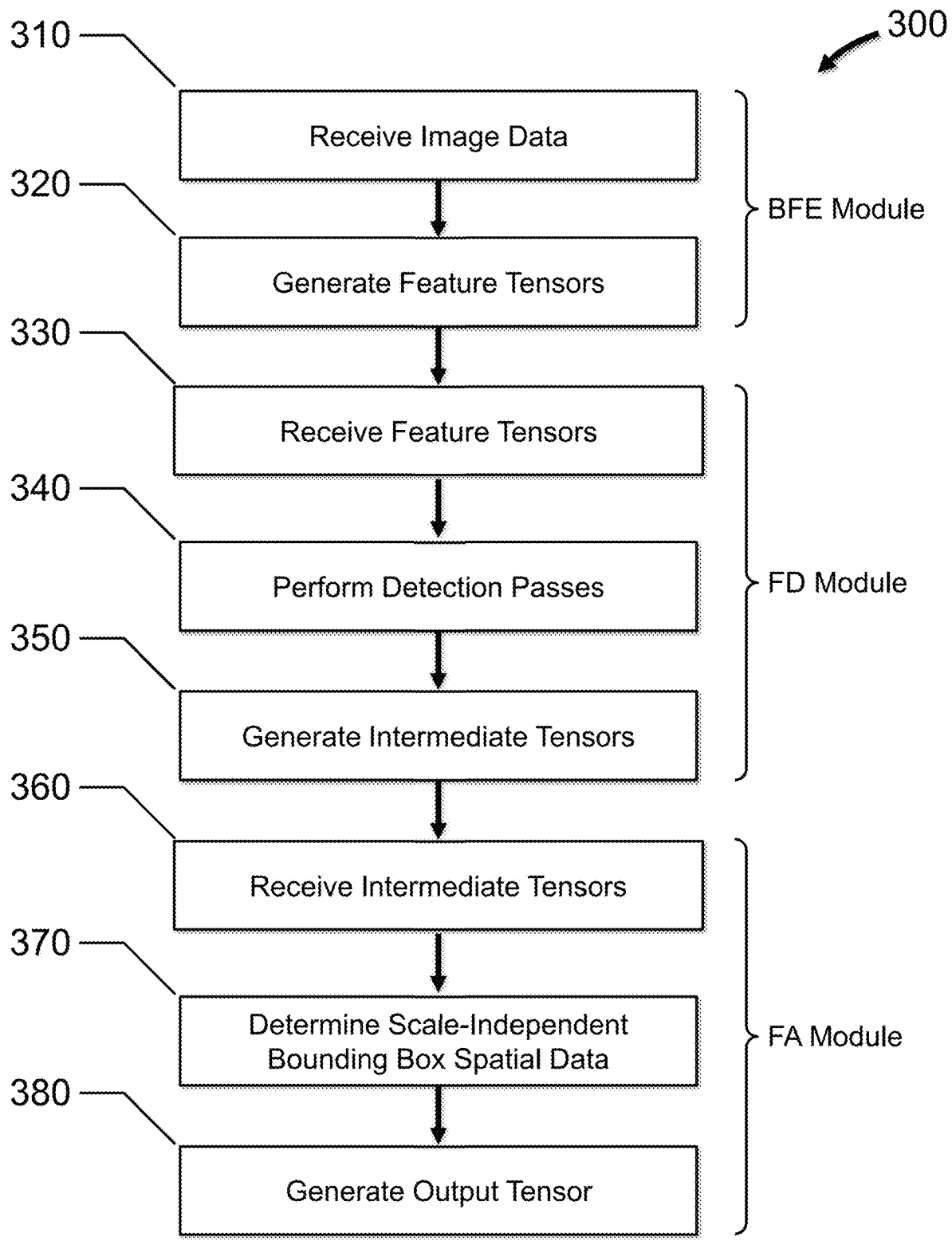
FIG. 6 depicts a flow diagram representing functionality associated with object detection, in accordance with an embodiment of the present disclosure.

FIG. 6 depicts a depict flow diagram 400 representing functionality associated with detecting an object, in accordance with an embodiment of the present disclosure.

In this embodiment, the functionality at 410 and 420 are performed at BFE module 110, the functionality at 430, 440 and 450 are performed at FD module 120, and the functionality at 460, 470 and 480 are performed at FA module 170.

At 410, image data is received. The image data include at least one object.

At 420, a number of feature tensors are generated based on the image data. Each feature tensor has a different scale.

At 430, the feature tensors are received from the BFE module.

At 440, a number of detection passes are performed. Each detection pass includes applying a random dropout mask to the feature tensors, and, for each feature tensor, determining scale dependent bounding box spatial data including mean corner co-ordinates and covariance matrices for the corner co ordinates for a number of scale-dependent bounding boxes for the object.

At 450, an intermediate tensor associated with each feature tensor is generated. Each intermediate tensor includes the scale-dependent bounding box spatial data for each detection pass for the associated feature tensor.

At 460, the intermediate tensors from the FD module are received.

At 470, scale-independent bounding box spatial data are determined based on the intermediate tensors. The scale-independent bounding box spatial data include mean corner co-ordinates and covariance matrices for the corner co-ordinates for a scale-independent bounding box for the object.

At 480, an output tensor is generated. The output tensor includes the scale-independent bounding box spatial data.

The embodiments described herein are combinable.

In one embodiment, a hardware accelerator for object detection comprises a backbone feature extraction (BFE) module, a feature detection (FD) module and a filter and averaging (FA) module. The BFE module is configured to receive image data including at least one object, and generate a number of feature tensors based on the image data, each feature tensor having a different scale. The FD module is configured to receive the feature tensors from the BFE module, perform a number of detection passes, each detection pass including apply a random dropout mask to the feature tensors, and, for each feature tensor, determine scale-dependent bounding box spatial data including mean corner co-ordinates and covariance matrices for the corner co-ordinates for a number of scale-dependent bounding boxes for the object, and generate an intermediate tensor associated with each feature tensor, each intermediate tensor including the scale-dependent bounding box spatial data for each detection pass for the associated feature tensor. The FA module is configured to receive the intermediate tensors from the FD module, determine scale-independent bounding box spatial data based on the intermediate tensors, the scale-independent bounding box spatial data including mean corner co-ordinates and covariance matrices for the corner co-ordinates for a scale-independent bounding box for the object, and generate an output tensor including the scale-independent bounding box spatial data.

In another embodiment of the hardware accelerator, each feature tensor includes feature map data defined by a height, a width, and a number of channels, and the scale of the feature tensor is defined as height·width.

In another embodiment of the hardware accelerator, the FD module includes a dropout mask generation module configured to generate a random dropout mask for each feature tensor for each detection pass; and a number of detector heads, each detector head including a number of convolutional modules and at least one dropout mask application module, each detector head configured to receive a different feature tensor, and for each detection pass, determine the number of scale-dependent bounding boxes for the object based on the feature tensor and the respective dropout mask, and determine the scale-dependent bounding box spatial data based on the number of scale-dependent bounding boxes.

In another embodiment of the hardware accelerator, each detector head is configured to determine objectness scores and class probabilities.

In another embodiment of the hardware accelerator, the FD module includes a first detector head and a second detector head, the first detector head is configured to receive a first feature tensor having a first scale, and the second detector head is configured to receive a second feature tensor having a second scale larger than the first scale; the second detector head includes an up-sampler module and a concatenation module, the up-sampler module is configured to receive the first feature tensor from a first convolutional module of the first detector head and increase the scale of the first feature tensor to match the scale of the second feature tensor, and the concatenation module is configured to concatenate the up-scaled first feature tensor and the second feature tensor, and provide the concatenated second feature tensor to a first convolutional module of the second detector head; and the concatenated second feature tensor has a total number of channels equal to the number of channels of the up-scaled first feature tensor plus the number of channels of the second feature tensor.

In another embodiment of the hardware accelerator, the FD module includes a third detector head configured to receive a third feature tensor having a third scale larger than the second scale; the third detector head includes an up-sampler module and a concatenation module, the up-sampler module is configured to receive the second feature tensor from a first convolutional module of the second detector head and increase the scale of the second feature tensor to match the scale of the third feature tensor, the concatenation module is configured to concatenate the up-scaled second feature tensor and the third feature tensor, and provide the concatenated third feature tensor to a first convolutional module of the third detector head; and the concatenated third feature tensor has a total number of channels equal to the number of channels of the up-scaled second feature tensor plus the number of channels of the third feature tensor.

In another embodiment of the hardware accelerator, the first detector head further includes a first mask module coupled to the first convolutional module and the dropout mask generation module, a second convolutional module coupled to the first mask module, a second mask module coupled to the second convolutional module and the dropout mask generation module, and a third convolutional module coupled to the second mask module; the second detector head further includes a first mask module coupled to the first convolutional module and the dropout mask generation module, a second convolutional module coupled to the first mask module, a second mask module coupled to the second convolutional module and the dropout mask generation module, and a third convolutional module coupled to the second mask module; and the third detector head further includes a first mask module coupled to the first convolutional module and the dropout mask generation module, a second convolutional module coupled to the first mask module, a second mask module coupled to the second convolutional module and the dropout mask generation module, and a third convolutional module coupled to the second mask module.

In another embodiment of the hardware accelerator, the BFE module includes a convolutional neural network (CNN) model.

In another embodiment of the hardware accelerator, the CNN model is a residual network (ResNet) model.

In another embodiment of the hardware accelerator, the dropout mask generation module includes a Bernoulli mask generator, and the FA module includes a Monte Carlo simulation model.

In one embodiment, a method for detecting an object comprises, at a backbone feature extraction (BFE) module, receiving image data including at least one object, and generating a number of feature tensors based on the image data, each feature tensor having a different scale; at a feature detection (FD) module, receiving the feature tensors from the BFE module, performing a number of detection passes, each detection pass including applying a random dropout mask to the feature tensors, for each feature tensor, determining scale-dependent bounding box spatial data including mean corner co-ordinates and covariance matrices for the corner co-ordinates for a number of scale-dependent bounding boxes for the object, and generating an intermediate tensor associated with each feature tensor, each intermediate tensor including the scale-dependent bounding box spatial data for each detection pass for the associated feature tensor; at a filter and averaging (FA) module, receiving the intermediate tensors from the FD module, determining scale-independent bounding box spatial data based on the intermediate tensors, the scale-independent bounding box spatial data including mean corner co-ordinates and covariance matrices for the corner co-ordinates for a scale-independent bounding box for the object, and generating an output tensor including the scale-independent bounding box spatial data.

In another embodiment of the method, each feature tensor includes feature map data defined by a height, a width, and a number of channels, and the scale of the feature tensor is defined as height·width.

In another embodiment of the method, the method further comprises at the FD module, generating, by a dropout mask generation module, a random dropout mask for each feature tensor for each detection pass; and receiving, at a number of detector heads, a different feature tensor, each detector head including a number of convolutional modules and at least one dropout mask application module, said performing each detection pass includes determining, at each detector head, the number of scale-dependent bounding boxes for the object based on the feature tensor and the respective dropout mask, and determining, at each detector head, the scale-dependent bounding box spatial data based on the number of scale-dependent bounding boxes.

In another embodiment of the method, said performing each detection pass includes determining, at each detector head, objectness scores and class probabilities.

In another embodiment of the method, the FD module includes a first detector head and a second detector head that includes an up-sampler module and a concatenation module, and the method further comprises, at the first detector head, receiving a first feature tensor having a first scale; at the second detector head, receiving a second feature tensor having a second scale larger than the first scale, receiving the first feature tensor from a first convolutional module of the first detector head, increasing, at the up-sampler module, the scale of the first feature tensor to match the scale of the second feature tensor, concatenating, at the concatenation module, the up-scaled first feature tensor and the second feature tensor, and providing the concatenated second feature tensor to a first convolutional module of the second detector head, the concatenated second feature tensor has a total number of channels equal to the number of channels of the up-scaled first feature tensor plus the number of channels of the second feature tensor.

In another embodiment of the method, the FD module includes a third detector head that includes an up-sampler module and a concatenation module, and the method further comprises at the third detector head, receiving a third feature tensor having a third scale larger than the second scale, receiving the second feature tensor from the first convolutional module of the second detector head, increasing, at the up-sampler module, the scale of the second feature tensor to match the scale of the third feature tensor, concatenating, at the concatenation module, the up-scaled second feature tensor and the third feature tensor, and providing the concatenated third feature tensor to a first convolutional module of the third detector head, the concatenated third feature tensor has a total number of channels equal to the number of channels of the up-scaled second feature tensor plus the number of channels of the third feature tensor.

In another embodiment of the method, the method further comprises at the first detector head, performing, by the first convolutional module, convolutional operations on the first feature tensor to update the first feature tensor, performing, by a first mask module, a masking operation on the first feature tensor to mask the first feature tensor, performing, by a second convolutional module, convolutional operations on the first feature tensor to update the first feature tensor, performing, by a second mask module, a masking operation on the first feature tensor to mask the first feature tensor, performing, by a third convolutional module, convolutional operations on the first feature tensor to update the first feature tensor, and generating, by an intermediate tensor generation module, a first intermediate tensor based on the first feature tensor; at the second detector head, performing, by the first convolutional module, convolutional operations on the second feature tensor to update the second feature tensor, performing, by a first mask module, a masking operation on the second feature tensor to mask the second feature tensor, performing, by a second convolutional module, convolutional operations on the second feature tensor to update the second feature tensor, performing, by a second mask module, a masking operation on the second feature tensor to mask the second feature tensor, performing, by a third convolutional module, convolutional operations on the second feature tensor to update the second feature tensor, and generating, by an intermediate tensor generation module, a second intermediate tensor based on the second feature tensor; at the third detector head, performing, by the first convolutional module, convolutional operations on the third feature tensor to update the third feature tensor, performing, by the first mask module, a masking operation on the third feature tensor to mask the third feature tensor, performing, by a second convolutional module, convolutional operations on the third feature tensor to update the third feature tensor, performing, by a second mask module, a masking operation on the third feature tensor to mask the third feature tensor, performing, by a third convolutional module, convolutional operations on the third feature tensor to update the third feature tensor, and generating, by an intermediate tensor generation module, a third intermediate tensor based on the third feature tensor.

In another embodiment of the method, the BFE module includes a convolutional neural network (CNN) model.

In another embodiment of the method, the CNN model is a residual network (ResNet) model.

In another embodiment of the method, the random dropout mask is a Bernoulli mask, and the FA module includes a Monte Carlo simulation model.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A hardware accelerator for object detection, comprising:
   a backbone feature extraction (BFE) module configured to:
      receive image data including at least one object, and
      generate a number of feature tensors based on the image data, each feature tensor having a different scale;
   a feature detection (FD) module configured to:
      receive the feature tensors from the BFE module,
      perform a number of detection passes, each detection pass including:
         apply a random dropout mask to the feature tensors, and
         for each feature tensor, determine scale-dependent bounding box spatial data including mean corner co-ordinates and covariance matrices for the corner co-ordinates for a number of scale-dependent bounding boxes for the object, and
      generate an intermediate tensor associated with each feature tensor, each intermediate tensor including the scale-dependent bounding box spatial data for each detection pass for the associated feature tensor; and
   a filter and averaging (FA) module configured to:
      receive the intermediate tensors from the FD module, determine scale-independent bounding box spatial data based on the intermediate tensors, the scale-independent bounding box spatial data including mean corner co-ordinates and covariance matrices for the corner co-ordinates for a scale-independent bounding box for the object, and generate an output tensor including the scale-independent bounding box spatial data.

2. The hardware accelerator according to claim 1, where each feature tensor includes feature map data defined by a height, a width, and a number of channels, and the scale of the feature tensor is defined as height·width.

3. The hardware accelerator according to claim 2, where the FD module includes:

a dropout mask generation module configured to generate a random dropout mask for each feature tensor for each detection pass; and a number of detector heads, each detector head including a number of convolutional modules and at least one dropout mask application module, each detector head configured to:

receive a different feature tensor, and for each detection pass, determine the number of scale-dependent bounding boxes for the object based on the feature tensor and the respective dropout mask, and determine the scale-dependent bounding box spatial data based on the number of scale-dependent bounding boxes.

4. The hardware accelerator according to claim 3, where each detector head is configured to determine objectness scores and class probabilities.

5. The hardware accelerator according to claim 3, where:

the FD module includes a first detector head and a second detector head, the first detector head is configured to receive a first feature tensor having a first scale, and the second detector head is configured to receive a second feature tensor having a second scale larger than the first scale;

the second detector head includes an up-sampler module and a concatenation module, the up-sampler module is configured to receive the first feature tensor from a first convolutional module of the first detector head and increase the scale of the first feature tensor to match the scale of the second feature tensor, and the concatenation module is configured to concatenate the up-scaled first feature tensor and the second feature tensor, and provide the concatenated second feature tensor to a first convolutional module of the second detector head; and the concatenated second feature tensor has a total number of channels equal to the number of channels of the up-scaled first feature tensor plus the number of channels of the second feature tensor.

6. The hardware accelerator according to claim 5, where:

the FD module includes a third detector head configured to receive a third feature tensor having a third scale larger than the second scale;

the third detector head includes an up-sampler module and a concatenation module, the up-sampler module is configured to receive the second feature tensor from a first convolutional module of the second detector head and increase the scale of the second feature tensor to match the scale of the third feature tensor, the concatenation module is configured to concatenate the up-scaled second feature tensor and the third feature tensor, and provide the concatenated third feature tensor to a first convolutional module of the third detector head; and the concatenated third feature tensor has a total number of channels equal to the number of channels of the up-scaled second feature tensor plus the number of channels of the third feature tensor.

7. The hardware accelerator according to claim 6, where:

the first detector head further includes a first mask module coupled to the first convolutional module and the dropout mask generation module, a second convolutional module coupled to the first mask module, a second mask module coupled to the second convolutional module and the dropout mask generation module, and a third convolutional module coupled to the second mask module;

the second detector head further includes a first mask module coupled to the first convolutional module and the dropout mask generation module, a second convolutional module coupled to the first mask module, a second mask module coupled to the second convolutional module and the dropout mask generation module, and a third convolutional module coupled to the second mask module; and the third detector head further includes a first mask module coupled to the first convolutional module and the dropout mask generation module, a second convolutional module coupled to the first mask module, a second mask module coupled to the second convolutional module and the dropout mask generation module, and a third convolutional module coupled to the second mask module.

8. The hardware accelerator according to claim 1, where the BFE module includes a convolutional neural network (CNN) model.

9. The hardware accelerator according to claim 8, where the CNN model is a residual network (ResNet) model.

10. The hardware accelerator according to claim 1, where the dropout mask generation module includes a Bernoulli mask generator, and the FA module includes a Monte Carlo simulation model.

11. A method for detecting an object, comprising:

at a backbone feature extraction (BFE) module:

receiving image data including at least one object;

generating a number of feature tensors based on the image data, each feature tensor having a different scale;

at a feature detection (FD) module:

receiving the feature tensors from the BFE module;

performing a number of detection passes, each detection pass including:

applying a random dropout mask to the feature tensors;

for each feature tensor, determining scale-dependent bounding box spatial data including mean corner co-ordinates and covariance matrices for the corner co-ordinates for a number of scale-dependent bounding boxes for the object;

generating an intermediate tensor associated with each feature tensor, each intermediate tensor including the scale-dependent bounding box spatial data for each detection pass for the associated feature tensor;

at a filter and averaging (FA) module:

receiving the intermediate tensors from the FD module;

determining scale-independent bounding box spatial data based on the intermediate tensors, the scale-independent bounding box spatial data including mean corner co-ordinates and covariance matrices for the corner co-ordinates for a scale-independent bounding box for the object; and generating an output tensor including the scale-independent bounding box spatial data.

12. The method according to claim 11, where each feature tensor includes feature map data defined by a height, a width, and a number of channels, and the scale of the feature tensor is defined as height·width.

13. The method according to claim 12, further comprising at the FD module:
   generating, by a dropout mask generation module, a random dropout mask for each feature tensor for each detection pass; and
   receiving, at a number of detector heads, a different feature tensor, each detector head including a number of convolutional modules and at least one dropout mask application module,
   where said performing each detection pass includes:
      determining, at each detector head, the number of scale-dependent bounding boxes for the object based on the feature tensor and the respective dropout mask, and
      determining, at each detector head, the scale-dependent bounding box spatial data based on the number of scale-dependent bounding boxes.

14. The method according to claim 13, where said performing each detection pass includes determining, at each detector head, objectness scores and class probabilities.

15. The method according to claim 13, where the FD module includes a first detector head and a second detector head that includes an up-sampler module and a concatenation module, and the method further comprises:
   at the first detector head:
      receiving a first feature tensor having a first scale;
   at the second detector head:
      receiving a second feature tensor having a second scale larger than the first scale;
      receiving the first feature tensor from a first convolutional module of the first detector head;
      increasing, at the up-sampler module, the scale of the first feature tensor to match the scale of the second feature tensor;
      concatenating, at the concatenation module, the up-scaled first feature tensor and the second feature tensor; and
      providing the concatenated second feature tensor to a first convolutional module of the second detector head,
   where the concatenated second feature tensor has a total number of channels equal to the number of channels of the up-scaled first feature tensor plus the number of channels of the second feature tensor.

16. The method according to claim 15, where the FD module includes a third detector head that includes an up-sampler module and a concatenation module, and the method further comprises:
   at the third detector head:
      receiving a third feature tensor having a third scale larger than the second scale;
      receiving the second feature tensor from the first convolutional module of the second detector head;
      increasing, at the up-sampler module, the scale of the second feature tensor to match the scale of the third feature tensor;
      concatenating, at the concatenation module, the up-scaled second feature tensor and the third feature tensor; and
      providing the concatenated third feature tensor to a first convolutional module of the third detector head,
   where the concatenated third feature tensor has a total number of channels equal to the number of channels of the up-scaled second feature tensor plus the number of channels of the third feature tensor.

17. The method according to claim 16, further comprising:
   at the first detector head:
      performing, by the first convolutional module, convolutional operations on the first feature tensor to update the first feature tensor;
      performing, by a first mask module, a masking operation on the first feature tensor to mask the first feature tensor;
      performing, by a second convolutional module, convolutional operations on the first feature tensor to update the first feature tensor;
      performing, by a second mask module, a masking operation on the first feature tensor to mask the first feature tensor;
      performing, by a third convolutional module, convolutional operations on the first feature tensor to update the first feature tensor;
      generating, by an intermediate tensor generation module, a first intermediate tensor based on the first feature tensor;
   at the second detector head:
      performing, by the first convolutional module, convolutional operations on the second feature tensor to update the second feature tensor;
      performing, by a first mask module, a masking operation on the second feature tensor to mask the second feature tensor;
      performing, by a second convolutional module, convolutional operations on the second feature tensor to update the second feature tensor;
      performing, by a second mask module, a masking operation on the second feature tensor to mask the second feature tensor;
      performing, by a third convolutional module, convolutional operations on the second feature tensor to update the second feature tensor;
      generating, by an intermediate tensor generation module, a second intermediate tensor based on the second feature tensor;
   at the third detector head:
      performing, by the first convolutional module, convolutional operations on the third feature tensor to update the third feature tensor;
      performing, by the first mask module, a masking operation on the third feature tensor to mask the third feature tensor;
      performing, by a second convolutional module, convolutional operations on the third feature tensor to update the third feature tensor;
      performing, by a second mask module, a masking operation on the third feature tensor to mask the third feature tensor;
      performing, by a third convolutional module, convolutional operations on the third feature tensor to update the third feature tensor; and
      generating, by an intermediate tensor generation module, a third intermediate tensor based on the third feature tensor.

18. The method according to claim 11, where the BFE module includes a convolutional neural network (CNN) model.

19. The method according to claim 18, where the CNN model is a residual network (ResNet) model.

20. The method according to claim 11, where the random dropout mask is a Bernoulli mask, and the FA module includes a Monte Carlo simulation model.

\* \* \* \* \*